United States Patent [19]
Douglas

[11] Patent Number: 5,041,362
[45] Date of Patent: Aug. 20, 1991

[54] DRY DEVELOPABLE RESIST ETCH CHEMISTRY

[75] Inventor: Monte A. Douglas, Coppell, Tex.

[73] Assignee: Texas Instruments Incorporated, Dallas, Tex.

[21] Appl. No.: 377,027

[22] Filed: Jul. 6, 1989

[51] Int. Cl.[5] .............................................. G03C 5/00
[52] U.S. Cl. ................................... 430/313; 430/325; 430/326; 430/323
[58] Field of Search ................ 430/313, 325, 326, 323

[56] References Cited

U.S. PATENT DOCUMENTS

| | | | |
|---|---|---|---|
| 4,551,418 | 11/1985 | Hult et al. | 430/325 |
| 4,768,291 | 9/1988 | Palmer | 430/323 |
| 4,808,511 | 2/1989 | Holmes | 430/325 |
| 4,810,601 | 3/1989 | Allen et al. | 430/323 |
| 4,882,008 | 11/1989 | Garza et al. | 430/313 |
| 4,921,778 | 5/1990 | Thackeray et al. | 430/326 |
| 4,931,351 | 6/1990 | McColgin et al. | 430/323 |

OTHER PUBLICATIONS

Taylor et al, "The Role of Inorganic Materials in Dry--Processed Resist Technology", 400 Solid State Technol., 27(2), Feb. 1984, pp. 145-155.
Coopmans, et al., Solid State Technology, Jun. 1987; "DESIRE: A New Route to Submicron Optical Lithography".
Visser, et al., SPIE Proc., 1987, "Mechanism and Kinetics of Silylation of Resist Layers from the Gas Phase".
Reichmanis, et al., Solid State Technology, Aug. 1985, "Approaches to Resists for Two-Level RIE Pattern Transfer Applications".
Roland, et al., SPIE Proc.; "The Mechanism of the Desire Process".

Primary Examiner—Charles L. Bowers, Jr.
Assistant Examiner—Thomas R. Neville
Attorney, Agent, or Firm—James C. Kesterson; James T. Comfort; Melvin Sharp

[57] ABSTRACT

A photoresist layer (16) is selectively exposed to ultraviolet radiation (22). The exposed regions (23) are silylated with a silicon-liberating compound such as HMDS to create silylated regions (29). A plasma (32) is formed from a compound including at least one central atom and hydrogen. This plasma is used to differentially etch the non-protected regions (30) of the photoresist while forming a hard mask (42) from the silylated regions (29). Formation of filaments (38) on the developed photoresist sidewalls is avoided because of the low mass of the hydrogen ions and the volatility of any hydrides produced from materials sputtered from the substrate. Any filaments which are formed are easily cleaned up with conventional chemistry.

23 Claims, 2 Drawing Sheets

DRY DEVELOPABLE RESIST ETCH CHEMISTRY

TECHNICAL FIELD OF THE INVENTION

This invention relates in general to microlithography and in particular to a microlithographic process utilizing dry etching of a resist by a hydrogen-liberating source.

BACKGROUND OF THE INVENTION

As integrated circuits have become smaller, the demands to achieve submicron resolution with sufficient line width control on a substrate have become increasingly important. This in turn has led to problems in patterning integrated circuit workpiece surfaces with extreme topography by means of a single photoresist layer.

To meet this problem, bilayer and trilayer photoresist systems have been developed. Standard multilayer lithographic techniques, however, have problems in throughput rates, complications of processing, uniformity control, cleanliness, layer cracking and removal of deposited layers. Additionally, although the multilayer systems prove adequate for building test designs at small geometries, their introduction into the production line is not very likely due to the high complexity of the processes.

More recently, single-layer and multi-layer photoresist technologies have been developed which obtain more desirable characteristics than the older multilayered systems. One example of these technologies is a photoresist process called DESIRE, an acronym for diffusion-enhanced silylating resist. Silylation is a process whereby silicon is incorporated into a polymer by exposing the material to a gaseous or liquid silicon-bearing compound such as hexamethyldisilazane (HMDS). The DESIRE process has been found to be highly selective in transforming a latent optical image into a latent "silicon" image. The silicon image is subsequently used to produce a relief image by dry-etching in oxygen. L, F. Coopmans et al., "DESIRE: A New Route to Submicron Optical Lithography", *Solid State Technology*, June, 1987.

Typically, oxygen is used as a reagent to dry etch/dry develop multi-layer and new single-layer, surface-imaging resists. The use of oxygen has several drawbacks. First, the relatively heavy oxygen ions, such as $O_2+$, sputter underlying material (especially metal) onto the photoresist sidewalls. Second, the sputtered material becomes oxidized, making it more difficult to remove in situ. Third, ion bombardment by high-mass $O_2+$ may cause damage to the substrate and to the mask, reducing definition. This results in reduced yields.

A need has therefore arisen for an improved photolithographic dry-develop process which does not have the unwanted side effects of using conventional oxygen reagents to develop the photoresist.

SUMMARY OF THE INVENTION

One aspect of the present invention comprises a process for applying a pattern to an integrated circuit workpiece. An organic photoresist layer is deposited on a workpiece. The outside surface of the photoresist is selectively exposed to a light source to which the photoresist is sensitive. This light exposure creates a latent pattern image on the outside surface of the photoresist layer composed of exposed portions and unexposed portions. The photoresist layer is next exposed to a silicon-liberating compound which selectively reacts with exposed portions to create silylated portions on the outside surface of the photoresist layer. The silylating agent is preferably hexamethyldisilazane. A plasma is formed from a source including hydrogen and at least one central atom. Central atoms in the plasma react with the silylated portions to create a hard mask. Hydrogen atoms from the plasma anisotropically and differentially etch the photoresist layer at an etch rate ratio (uv-unexposed portions to hard mask) of about 3:1. The plasma-forming compound is preferably ammonia, which creates hard mask portions with Si-N bonds. A highly satisfactory patterned image is developed on the integrated circuit workpiece surface.

The present invention has application for any system using a hard mask as an imaging layer. The hard mask may be formed by selective incorporation of species or by cross-linking of the photoresist that has been treated by deep ultraviolet.

The present invention presents several technical advantages over the conventional processes using oxygen etchants.

Because hydrogen has a low mass, there is less sputtering of material. Such material as is sputtered gets reduced to form hydrides, most of which are volatile. Such hydrides as are not volatile are much more easily removed by conventional clean-up processes.

BRIEF DESCRIPTION OF THE DRAWINGS

Other aspects of the invention and their advantages will be discerned after studying the Detailed Description in conjunction with the Drawings in which.

DETAILED DESCRIPTION OF THE INVENTION

Figure 1:
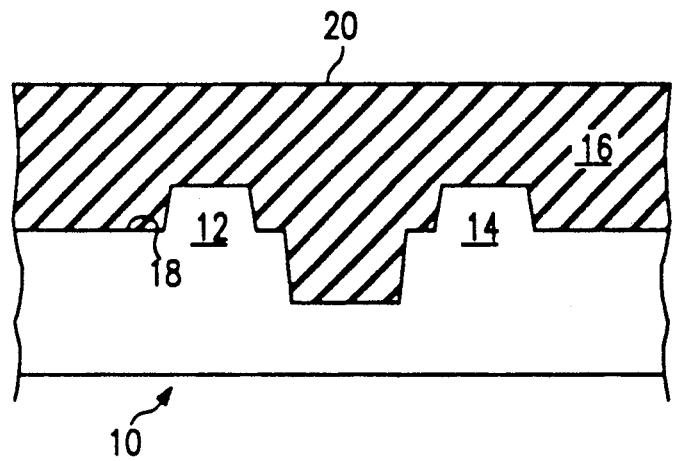
FIG. 1 is a greatly enlarged schematic cross-sectional view of an integrated circuit workpiece illustrating photoresist deposition step in a photolithographic process according to the present invention.

Referring initially to FIG. 1, an integrated circuit workpiece is shown in an enlarged schematic cross-sectional view and is generally designated at 10. Workpiece 10 has a nonuniform topographic profile that includes eminences 12 and 14. The workpiece 10 may be at any of various stages of fabricating an integrated circuit. For example, workpiece 10 at this stage may have an outer surface that is predominantly an insulator, silicon or other semiconductor, or alternatively may be metallized with aluminum, copper, titanium-tungsten or other metal conductors (not shown) that have been formed to connect to semiconductor devices (not shown) in the workpiece 10.

In a process according to the present invention, an organic photoresist layer 16 is deposited on an outer surface 18 of workpiece 10. In a preferred embodiment, the photoresist layer 16 is a Novolak-based photoresist formulation. One such standard Novolak-based photoresist compound is Shipley 1400 Series Resist. Layer 16 can also be other organic photoresist compounds that are etchable by a plasma etchant which, however, is resisted by hard mask resist layers. Layer 16 may be spun on to a thickness of approximately 0.5 microns to 5 microns such that an upper surface 20 thereof is substantially planar. The photoresist thickness should be chosen as the minimum that will give good step coverage and substantial upper surface planarity. Planar surface 20 assures that the image to be patterned on outer surface 18 will be correctly focused.

Figure 2:
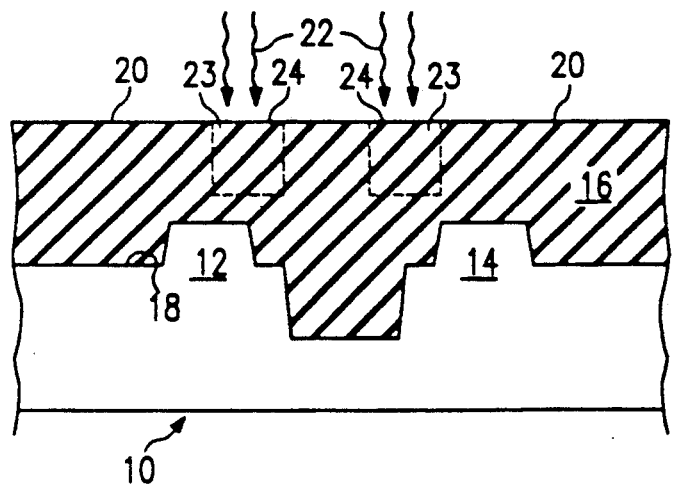
FIG. 2 is a cross-sectional view of the workpiece shown in FIG. 1, showing a subsequent selective exposure of the resist to ultraviolet light.

Referring now to FIG. 2, a photolithographic pattern is used to selectively expose layer 16 to an ultraviolet light source 22, making exposed regions 23 susceptible to a subsequent silylating reaction described below. Photoresist layer 16 can be dyed to help rule out any reflection from the surface so that scattering and interference effects can be avoided. Exposed regions 23 each have exposed outer surfaces 24.

Figure 3:
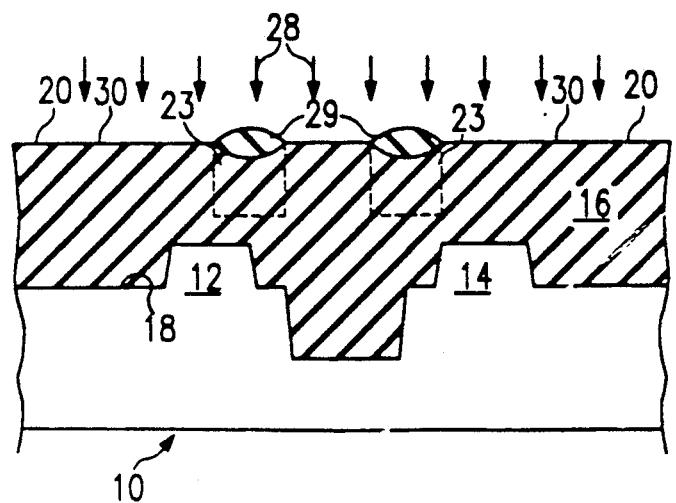
FIG. 3 is a cross-sectional view of the workpiece shown in FIG. 2, showing a subsequent silylating step according to the invention.

Turning now to FIG. 3, layer 16 is exposed to a source of a vaporized silicon-liberating compound 28 such as hexamethyldisilazane (HMDS). When exposed surfaces 24 are subjected to the HMDS 28, silylated regions 29 are formed in layer 16. The selectivity of the chemical reaction results in areas 30 of the surface 20 that do not incorporate silicon and regions 29 that incorporate silicon. The reaction between exposed surface 24 of photoresist 16 and the HMDS 28 is more particularly described in R. Visser et al., "Mechanisms and Kinetics of Silylation of Resist Layers from the Gas Phase", *SPIE* (1987).

During exposure, the irradiated regions 23 undergo photochemical modifications which enhance the diffusion of the silylating agent, i.e., HMDS. Consequently, silicon is incorporated into the Novolak resin during this process to a depth ranging from 100 to 250 nm depending on the silylation conditions. The silylating agent, in alternative embodiments, may be one of the following compounds: $SiH_4$, $Si(CH_3)_4$, $Si(C_2H_5)_4$, silicon-bearing azo compounds other than HMDS, and other silicon-bearing compounds that react with the photosensitized region. Other reagents containing inorganic atoms may be used to produce regions 29 having non-silylated compositions. For example, $GeH_4$, $TiCl_4$, $B_2H_6$ and $BCl_3$ may be used to create regions 29 that respectively incorporate germanium, titanium and boron. These alternative agents must be chosen such that they will form a hard mask when subjected to the etchant of the invention. For example, where $NH_3$ is the chosen etchant, the agent replacing HMDS must be able to form a nitride from nitrogen in the plasma.

Figure 4:
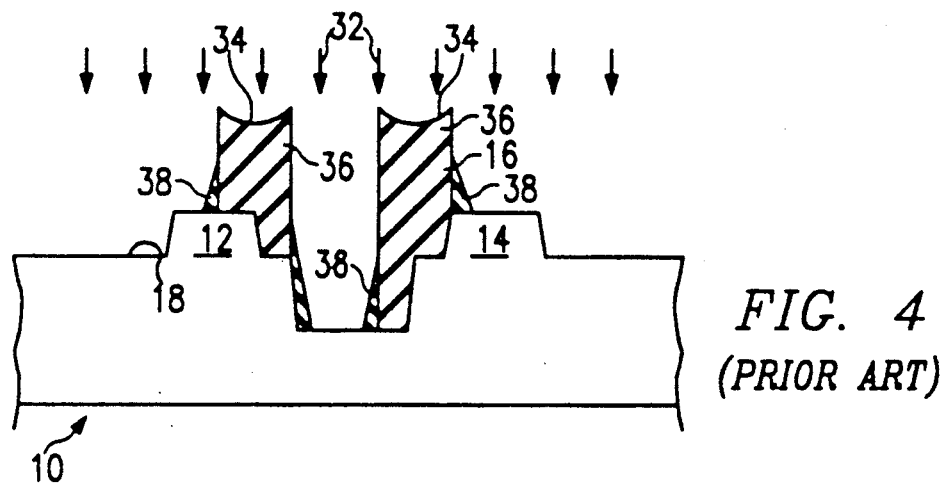
FIG. 4 is a cross-sectional view of the workpiece shown in FIG. 3, showing a subsequent oxygen-based plasma etching development step according to the prior art.

FIG. 4 shows a subsequent oxygen etching step according to the prior art. A plasma 32 is formed from oxygen and anistropically etches the workpiece 10. In the prior art system, the oxygen acts to form a silicon oxide-type hard mask (not shown) at the surface of each silylated region 29 while at the same time etching the unexposed areas 30 (see FIG. 3) of the photoresist layer 16.

As the etch proceeds, the original silylated regions 29 are gradually eroded away. At the same time, however, a new oxide hard mask surface 34 continually reforms to protect the photoresist 16 underneath.

Eventually, all of the unprotected photoresist will be etched away and the oxygen ions (such as $O_2^+$) will begin hitting the surface 18 of the workpiece 10. The heavy oxygen ions have a tendency to sputter the material they hit onto the sidewalls of the protected photoresist regions 36. Sidewall filaments 38 are therefore formed on the sidewalls of the protected photoresist regions 36 as the etching process continues. These sidewall filaments 38 are composed either of material which the oxygen ions 32 sputter from the surface 18 of the workpiece 10, or other oxides. For example, where the oxygen ions 32 hit a metal such as aluminum, the aluminum will subsequently sputter onto the sidewalls of the regions 36 and will react homogeneously or heterogeneously in large part to form aluminum oxide. Depending on the material of which the surface 18 is composed, the sidewall filaments can be composed of silicon dioxide, copper oxide, titanium oxide, tungsten oxide, or other relatively refractory oxides. In another example, where portions of surface 18 are nonreactive with oxygen, such as a nitride or oxide, these materials can also be sputtered by the oxygen without reaction therewith. In each case, a nonvolatile, difficult-to-remove oxide filament 38 is formed that may later cause malfunctions in the integrated circuit.

Figure 5:
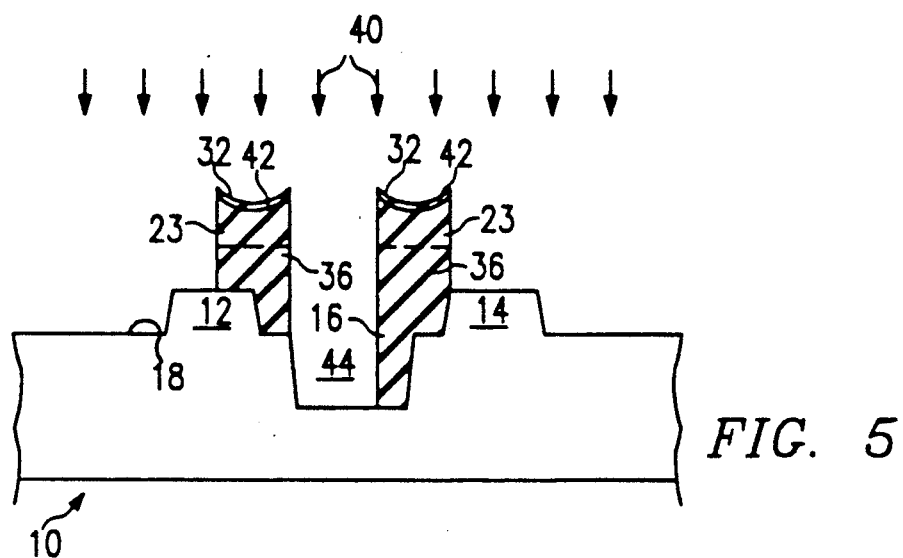
FIG. 5 is a cross-sectional view of the workpiece shown in FIG. 3, showing a subsequent plasma etching development step using a hydrogen-liberating compound according to the present invention.

Referring now to FIG. 5, workpiece 10 is preferably subjected to a magnetic ion etch (MIE) according to the invention, which is preferred because it produces a high number of ions at relatively low energies to produce the desired selectivity to differentially etch the unexposed surface 30 at a faster rate than silicon-based mask region 29 (see FIG. 3). The etchant according to the invention is formed from one or more compounds each having at least one central atom and one or more hydrogen atoms. Such etchants can be selected from plasmas made from ammonia, borane or phosphene to create the necessary hydrogen-liberating etch source. In addition, the hydrogen liberating source may be a halide of carbon, nitrogen, oxygen and sulfur. In each case, the etchant should have one or more central atoms that will react with the silicon in the silylated areas 29 to form nonvolatile, etch-resistant silicon compounds.

A preferred etchant source is ammonia. By using ammonia, the nitrogen dissociated in the plasma 40 will react with silicon in the masked region 29 (FIG. 3) to create a $Si_xN_y$ hard mask 42 that is relatively impervious to the hydrogen-liberating etchant 40. As the plasma etchant 40 is anistropic, masked region 29, and, after the region 29 is eroded away, hard mask 42, act to protect the regions 36 of photoresist layer 16 underneath. Even though etchant source 30 has some effect on removing masked region 29 and region 23 (FIG. 3), the relative extent of removal is less than that of the removal of region 30.

More generally, the reaction of the etchant with the photoresist may be expressed as follows:

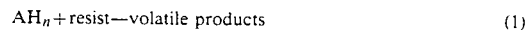

$AH_n$ + resist → volatile products    (1)

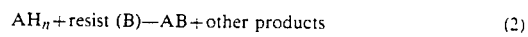

$AH_n$ + resist (B) → AB + other products    (2)

where "$AH_n$" is an etchant compound according to the invention that includes a preferably inorganic central atom and a number of hydrogen atoms; "resist" is non-silylated or otherwise nonreacted, exposed photoresist; "resist (B)" is silylated or otherwise reacted resist; and "AB" is a mask product that is formed on the surface of the silylated or otherwise reacted photoresist layer, and which has a greater resistance to the used etchant than "resist".

An etch rate ratio (ultraviolet-unexposed regions: hard mask) of about 3:1 has been obtained in a preferred embodiment of the invention.

In another embodiment of the invention, the hydrogen and nonhydrogen components of the etchant gas, such as $N_2$ and $H_2$, may be separately introduced into the reactor. Another etchant gas that may be used is hydrazine, $N_2H_2$.

In yet another embodiment of the invention, the etching process may take place in two steps. As much as 80% of the nonprotected regions of the photoresist layer 16 may be etched with a large-mass sputtering agent such as argon or oxygen in order to accelerate the damage to the etch resist. Thereafter, the etchant gas may be switched over to $A_xH_y$ chemistry.

FIG. 5 shows the result of the ammonia etch, in which an orifice 44 has been created which extends from the hard mask 42 down to the outer surface 18 of the integrated circuit workpiece 10.

It can be seen that no filament areas form on the developed photoresist sidewalls as they did in the prior art. There are at least three reasons for this. First, the relatively low mass of the bombarding hydrogen ions causes less physical sputtering than the much heavier oxygen ions. Second, such filaments as are formed tend to be volatile hydrides. Third, to the extent that nonvolatile hydrides are formed, they may be easily removed by wet cleanup chemistries known in the pertinent art.

To confirm the advantages of the present invention, an experiment was performed as detailed below.

EXAMPLE

A thick layer of standard Novolak-based resist was deposited onto a semiconductor workpiece. Next, the photoresist layer was selectively exposed to an ultraviolet light source having an I-line wavelength of 365 nm. After exposure of the ultraviolet light, the photoresist was baked at 160° C. on a hotplate. In conducting the silylation process, entrained hexamethyldisilazane (HMDS) as entrained in a nitrogen carrier was passed through a chamber at 450 standard cubic centimeters per minute for 160 seconds at 160° C.

The etching process was conducted in a parallel plate plasma reactor and ammonia was used as a hydrogen and nitrogen source. Ammonia was passed through the reactor at 200 standard cubic centimeters per minute. The electrical bias was −50 volts and the power was 400 watts. The reactor pressure was 500 millitorr. The showerhead was separated by 1.1 inches from the workpiece during the process of etching. The entire etch time was 230 seconds, and the result of the experiments indicated that 4,323 angstroms were removed from the UV-unexposed regions during the process, as determined by GCA Nanospec and Dectak instruments. The hard mask portions meanwhile had 1,325 angstroms etched away. The differential etching between the masked region and the unmasked region was calculated to have an etch rate ratio of 1:3.2.

While the present invention has been disclosed in conjunction with a silylated photoresist, it is also useful in multilayer hard mask systems. For example, in conventional trilayer systems, a thick, planarizing organic resist layer is first deposited over the chip topography. This is followed by an image transfer layer, which, for example, can be plasma-enhanced chemical vapor deposited polysilicon, silicon dioxide or spun-on glass. The top layer of this trilayer system is usually about 4,000 angstroms of imaging photoresist.

According to the invention, the first layer is processed using standard lithographic technology. The processed first layer is used as a mask to transfer an image to the middle layer using a dry etch process. This will leave the middle, hard mask layer selectively etched to the beginning of the planarization layer in some areas, while the hard mask layer remains unetched in other areas. According to the invention, a hydrogen-liberating source, which may be molecular hydrogen as well as those listed above, is used to selectively etch the planarization layer within orifices defined by the hard mask down to the substrate surface. The formation of sidewall filaments is avoided for the same reasons as they are avoided in the silylated photoresist case. Since in this embodiment it is unnecessary to create a hard mask from a single layer, the hydrogen source does not have to include one or more central atoms that will bind with a layer to make a hard mask. All that is necessary is a source of hydrogen.

In summary, an advantageous photolithographic process has been disclosed that features the use of a hydrogen-liberating etching source, such as ammonia. The photolithographic process of the invention confers significant advantages in terms of high resolution, better uniformity, and reduced complexity.

While preferred embodiments of the invention and their advantages have been disclosed in the above Detailed Description, the invention is not limited thereto but only by the spirit and scope of the appended claims.

What is claimed is:

1. A process for applying a pattern to a workpiece used un fabricating an integrated circuit, comprising the steps of:

depositing an organic photoresist resolution layer on the workpiece;

projecting a pattern image onto the resolution layer with a light source to which the resolution layer is sensitive to create at least one exposed portion of the resolution layer and at least one unexposed portion of the resolution layer;

reacting the exposed portion of the resolution layer to a silylating agent to create a silylated region;

forming a plasma which includes a hydrogen-liberating source and introducing said plasma into the reactor; and differentially etching the unexposed portion of the resolution layer with said hydrogen-liberating source in said plasma faster than the masked region until the surface of the workpiece is reached, said plasma including at least one inorganic atom for reacting with silicon form said silylated region to form a mask region of an etch resistant silicon compound.

2. The process of claim 1, wherein the step of depositing an organic photoresist resolution layer comprises the step of depositing a layer of Novolak-based photoresist.

3. The process of claim 1, wherein the step of exposing the resolution layer to the silylating agent comprises exposing the resolution layer to hexamethyldisilazane (HMDS).

4. The process of claim 1, wherein said hydrogen-liberating source is formed from ammonia.

5. The process of claim 1, wherein said hydrogen-liberating source is formed from hydrazine.

6. The process of claim 1, wherein the hydrogen-liberating source is selected from the group consisting of hydrides of carbon, boron, phosphorus, oxygen, nitrogen and sulfur.

7. The process of claim 1, and further comprising the step of:
forming the plasma from a compound having at least one inorganic central atom and at least one hydrogen atom.

8. The process of claim 1, and further comprising the step of:
separately introducing a source of inorganic atoms into the reactor.

9. The process of claim 8, wherein the hydrogen-liberating source consists essentially of hydrogen, the source of inorganic atoms consisting essentially of nitrogen.

10. A method for patterning an integrated circuit workpiece surface, comprising the steps of:
forming organic photoresist layers on the integrated circuit workpiece surface;
selectively exposing the outer surface of said photoresist layer to a light source to which the photoresist layer is sensitive to create a pattern image on said outside surface of said photoresist layer comprising exposed portions and nonexposed portions;
exposing said outside surface of said photoresist layer to hexamethyldisilazane to incorporate silicon into the exposed portions of said outside surface thereby forming silylated regions;
forming a plasma from a source including hydrogen and at least one central atom;
reacting the central atoms in the plasma with the silylated regions to create etch resistant portions containing compounds having silicon central atom bonds as said nonexposed portions are etched; and
anisotropically etching the outside surface with hydrogen form the plasma, said unexposed portions of said outside surface and said etch resistant portion being etched at a rate ratio of about at least 3:1.

11. The process of claim 10, wherein said source used to form said plasma is ammonia.

12. The process of claim 10, wherein said source used to form said plasma is selected from the group consisting of hydrides of boron, carbon, oxygen, phosphorus, sulfur and nitrogen.

13. In a process for fabricating an integrated circuit, a method for selectively etching a selectively exposed and silylated photoresist layer, comprising the steps of:
forming an etchant plasma from a source selected from the group consisting of ammonia and hydrozene thereby forming a compound including hydrogen and at least one central atom;
forming etch resistant mask from the silylated portions of the photoresist layer by reacting central atoms of the plasma with silicon atoms in the silylated portions; and
differentially etching the etch resistant mask and unexposed, unsilylated portions of the photoresist surface with hydrogen from the plasma at a favorable etch rate ratio between the etch resistant mask and the unexposed portions.

14. The process of claim 13, wherein said compound forming the etchant plasma is ammonia.

15. A process for dry-developing a resist layer, comprising the steps of:
forming a silylating region on preselected portions of an outer surface of the resist layer;
forming a plasma from a source containing hydrogen and at least one central atom for reacting with silicon from said silylated regions to form at etch resistant mask during an etching step; and
differentially etching portions of the resist layer not covered by the etch resistant mask with hydrogen species from the plasma such that said uncovered portions are etched away faster than the etch resistant mask.

16. The process of claim 15, wherein the hydrogen of said source is from a material selected from the group consisting of molecular hydrogen and a subgroup of compounds each having hydrogen and at least one central atom.

17. The process of claim 15, and further comprising the step of:
selecting the resist layer to be a photoresist;
selectively exposing portions of the photoresist to at least one light wavelength to which the photoresist is sensitive;
reacting the exposed resist portions to a first inorganic compound;
incorporating the atomic species into the exposed resist portions in response to said step of reacting to form said silylated regions; and
forming the hard mask by bonding central atoms from the plasma to said atomic species.

18. The process of claim 17 wherein said first compound is selected from the group consisting of silicon-liberating compounds, semiconductor hydrides, semiconductor halides, metal hydrides, metal halides, metal carbonyls, organometallic compounds, boron halides and boron hydrides.

19. The process of claim 17, wherein said source is selected from the group consisting of the hydrides of boron, carbon, nitrogen, oxygen, phosphorus, sulphur and silicon.

20. The method of claim 10 wherein said step of forming a plasma includes the steps of:
introducing a hydrogen-liberating source into the reactor;
separately introducing a source of inorganic atoms into the reactor.

21. The method of claim 17, wherein said plasma includes ammonia.

22. The method of claim 17, wherein said plasma includes hydrozene.

23. A process for applying a pattern to a workpiece used in fabricating an integrated circuit, comprising the steps of:
depositing an organic photoresist resolution layer on the workpiece;
projecting a pattern image onto the resolution layer with a light source to which the resolution layer is sensitive to create at least one exposed portion of the resolution layer and at least one unexposed portion of the resolution layer;
reacting the exposed portion of the resolution layer to a silylating agent to create a silylated region;
introducing a hydrogen-liberating source into the reactor;
separately introducing a source of inorganic atoms into the reactor;
forming a plasma from the hydrogen-liberating source and the source of inorganic atoms;
reacting said inorganic atoms with silicon form said silylated region to form a masked region;
differentially etching the unexposed portion of resolution layer with said hydrogen-liberating source faster than the masked region until the surface of the workpiece is reached.

* * * * *